United States Patent
Wilson et al.

(10) Patent No.: US 9,468,901 B2
(45) Date of Patent: Oct. 18, 2016

(54) PVDF PYROLYZATE ADSORBENT AND GAS STORAGE AND DISPENSING SYSTEM UTILIZING SAME

(71) Applicant: Entegris, Inc., Billerica, MA (US)

(72) Inventors: Shaun M. Wilson, Trumbull, CT (US); Edward A. Sturm, New Milford, CT (US)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 14/961,793

(22) Filed: Dec. 7, 2015

(65) Prior Publication Data

US 2016/0089655 A1 Mar. 31, 2016

Related U.S. Application Data

(63) Continuation of application No. 14/224,536, filed on Mar. 25, 2014, which is a continuation of application No. 13/329,254, filed on Dec. 17, 2011, now Pat. No. 8,679,231.

(60) Provisional application No. 61/434,219, filed on Jan. 19, 2011.

(51) Int. Cl.
*B01D 53/02* (2006.01)
*B01J 20/20* (2006.01)
(Continued)

(52) U.S. Cl.
CPC .............. *B01J 20/20* (2013.01); *B01D 53/02* (2013.01); *B01J 20/2808* (2013.01);
(Continued)

(58) Field of Classification Search
CPC .............. B01D 2253/202; B01D 2256/18; B01D 53/02; B01J 20/20; B01J 20/28011; B01J 20/28042; B01J 20/28078; B01J 20/3078; F17C 11/00; Y02C 20/10; Y10T 37/0318; Y10T 37/8593
See application file for complete search history.

(56) References Cited

U.S. PATENT DOCUMENTS

| 240,423 A | 4/1881 | James |
|---|---|---|
| 1,608,155 A | 11/1926 | Bamebey |

(Continued)

FOREIGN PATENT DOCUMENTS

| CN | 86100015 A | 7/1987 |
|---|---|---|
| CN | 1381404 A | 11/2002 |

(Continued)

OTHER PUBLICATIONS

Bagreev, A., et al., "Desulfurization of digester gas: prediction of activated carbon bed performance at low concentrations of hydrogen sulfide", "Catalysis Today", Dec. 15, 2004, pp. 329-337, vol. 99.

(Continued)

*Primary Examiner* — Christopher P Jones

(57) ABSTRACT

A polyvinylidene fluoride (PVDF) pyrolyzate adsorbent is described, having utility for storing gases in an adsorbed state, and from which adsorbed gas may be desorbed to supply same for use. The PVDF pyrolyzate adsorbent can be of monolithic unitary form, or in a bead, powder, film, particulate or other finely divided form. The adsorbent is particularly suited for storage and supply of fluorine-containing gases, such as fluorine gas, nitrogen trifluoride, carbo-fluoride gases, and the like. The adsorbent may be utilized in a gas storage and dispensing system, in which the adsorbent is contained in a supply vessel, from which sorbate gas can be selectively dispensed.

22 Claims, 2 Drawing Sheets

(51) Int. Cl.
*F17C 11/00* (2006.01)
*B01J 20/30* (2006.01)
*B01J 20/28* (2006.01)
*C23C 16/44* (2006.01)

(52) U.S. Cl.
CPC ... *B01J 20/28011* (2013.01); *B01J 20/28016* (2013.01); *B01J 20/28042* (2013.01); *B01J 20/28078* (2013.01); *B01J 20/28083* (2013.01); *B01J 20/3078* (2013.01); *C23C 16/4405* (2013.01); *F17C 11/00* (2013.01); *B01D 2253/102* (2013.01); *B01D 2253/202* (2013.01); *B01D 2256/18* (2013.01); *B01D 2257/204* (2013.01); *B01D 2257/2027* (2013.01); *B01D 2257/2047* (2013.01); *B01D 2257/40* (2013.01); *Y02C 20/10* (2013.01); *Y10T 137/0318* (2015.04); *Y10T 137/8593* (2015.04)

(56) References Cited

U.S. PATENT DOCUMENTS

| | | |
|---|---|---|
| 1,714,245 A | 5/1929 | Schaefer |
| 2,356,334 A | 8/1944 | Maude et al. |
| 2,423,702 A | 7/1947 | Hart |
| 2,450,289 A | 9/1948 | Marek |
| 2,556,292 A | 6/1951 | Newcum |
| 2,663,626 A | 12/1953 | Spangler |
| 2,970,452 A | 2/1961 | Beckman et al. |
| 2,971,607 A | 2/1961 | Caswell |
| 2,987,139 A | 6/1961 | Bush |
| 2,997,371 A | 8/1961 | Wadsworth et al. |
| 3,006,153 A | 10/1961 | Cook |
| 3,025,233 A | 2/1962 | Figert |
| 3,037,338 A | 6/1962 | Thomas et al. |
| 3,080,307 A | 3/1963 | Rinald |
| 3,093,564 A | 6/1963 | Weisman et al. |
| 3,116,132 A | 12/1963 | Haller et al. |
| 3,144,200 A | 8/1964 | Taylor et al. |
| 3,156,100 A | 11/1964 | Haettinger et al. |
| 3,176,444 A | 4/1965 | Kiyonaga |
| 3,264,803 A | 8/1966 | Read |
| 3,287,432 A | 11/1966 | Sensel |
| 3,415,069 A | 12/1968 | Hauser |
| 3,469,375 A | 9/1969 | Barrington et al. |
| 3,539,467 A | 11/1970 | Bozarth et al. |
| 3,608,273 A | 9/1971 | Fabuss et al. |
| 3,675,392 A | 7/1972 | Reighter |
| 3,713,273 A | 1/1973 | Coffee |
| 3,719,026 A | 3/1973 | Sand |
| 3,788,036 A | 1/1974 | Lee et al. |
| 3,839,128 A | 10/1974 | Arai |
| 3,859,421 A | 1/1975 | Hucke |
| 3,884,830 A | 5/1975 | Grant |
| 3,912,472 A | 10/1975 | Marble |
| 4,000,236 A | 12/1976 | Redfarn et al. |
| 4,023,701 A | 5/1977 | Dockery |
| 4,040,990 A | 8/1977 | Neely |
| 4,046,709 A | 9/1977 | Yuki |
| 4,082,694 A | 4/1978 | Wennerberg et al. |
| 4,099,936 A | 7/1978 | Tarancon |
| 4,139,416 A | 2/1979 | Palumbo et al. |
| 4,158,639 A | 6/1979 | Berty |
| 4,168,149 A | 9/1979 | Armond et al. |
| 4,263,018 A | 4/1981 | McCombs et al. |
| 4,302,224 A | 11/1981 | McCombs et al. |
| 4,343,770 A | 8/1982 | Simons |
| 4,373,938 A | 2/1983 | McCombs |
| 4,378,982 A | 4/1983 | McCombs |
| 4,384,957 A | 5/1983 | Crowder, III et al. |
| 4,386,947 A | 6/1983 | Mizuno et al. |
| 4,414,005 A | 11/1983 | De Bievre et al. |
| 4,477,265 A | 10/1984 | Kumar et al. |
| 4,478,839 A | 10/1984 | Benneche et al. |
| 4,526,887 A | 7/1985 | Sutt, Jr. |
| 4,528,281 A | 7/1985 | Sutt, Jr. |
| 4,540,678 A | 9/1985 | Sutt, Jr. |
| 4,552,571 A | 11/1985 | Dechene |
| 4,578,256 A | 3/1986 | Nishino et al. |
| 4,622,008 A | 11/1986 | Schulz et al. |
| 4,673,415 A | 6/1987 | Stanfor |
| 4,699,896 A | 10/1987 | Sing et al. |
| 4,723,967 A | 2/1988 | Tom |
| 4,738,693 A | 4/1988 | Tom |
| 4,738,694 A | 4/1988 | Godino et al. |
| 4,738,753 A | 4/1988 | Corato et al. |
| 4,744,221 A | 5/1988 | Knollmueller |
| 4,749,384 A | 6/1988 | Nowobilski et al. |
| 4,761,395 A | 8/1988 | Tom et al. |
| 4,788,973 A | 12/1988 | Kirchgeorg et al. |
| 4,801,308 A | 1/1989 | Keefer |
| 4,817,686 A | 4/1989 | Hatakeyama et al. |
| 4,830,643 A | 5/1989 | Sassa et al. |
| 4,869,733 A | 9/1989 | Stanford |
| 4,880,765 A | 11/1989 | Knoblauch et al. |
| 4,881,958 A | 11/1989 | Eckardt et al. |
| 4,957,897 A | 9/1990 | Maroldo et al. |
| 4,964,524 A | 10/1990 | Halene |
| 4,967,934 A | 11/1990 | Andonian |
| 4,989,160 A | 1/1991 | Garrett et al. |
| 5,021,391 A | 6/1991 | Agui et al. |
| 5,039,651 A | 8/1991 | Kosaka et al. |
| 5,051,117 A | 9/1991 | Prigge et al. |
| 5,071,820 A | 12/1991 | Quinn et al. |
| 5,089,244 A | 2/1992 | Parent et al. |
| 5,094,830 A | 3/1992 | Tom et al. |
| 5,098,880 A | 3/1992 | Gaffney et al. |
| 5,110,328 A | 5/1992 | Yokota et al. |
| 5,110,422 A | 5/1992 | Alperine et al. |
| 5,112,367 A | 5/1992 | Hill |
| 5,114,440 A | 5/1992 | Reiss |
| 5,133,787 A | 7/1992 | Diot et al. |
| 5,151,395 A | 9/1992 | Tom |
| 5,202,096 A | 4/1993 | Jain |
| 5,213,769 A | 5/1993 | Whitlock |
| 5,224,350 A | 7/1993 | Mehra |
| 5,238,469 A | 8/1993 | Briesacher et al. |
| 5,289,690 A | 3/1994 | Rockenfeller et al. |
| 5,350,513 A | 9/1994 | Markowitz |
| 5,356,852 A | 10/1994 | DeLiso et al. |
| 5,372,619 A | 12/1994 | Greinke et al. |
| 5,376,609 A | 12/1994 | Guile |
| 5,381,983 A | 1/1995 | Sakano et al. |
| 5,385,689 A | 1/1995 | Tom et al. |
| 5,409,526 A | 4/1995 | Zheng et al. |
| 5,416,056 A | 5/1995 | Baker |
| 5,417,742 A | 5/1995 | Tamhankar et al. |
| 5,429,662 A | 7/1995 | Fillet |
| 5,485,675 A | 1/1996 | Jones et al. |
| 5,505,825 A | 4/1996 | Gold et al. |
| 5,512,087 A | 4/1996 | Varner et al. |
| 5,518,528 A | 5/1996 | Tom et al. |
| 5,518,620 A | 5/1996 | Eguchi et al. |
| 5,549,736 A | 8/1996 | Coffield et al. |
| 5,599,380 A | 2/1997 | Koros |
| 5,599,764 A * | 2/1997 | Sharma .............. B01J 20/103 502/407 |
| 5,614,459 A | 3/1997 | Mondragon et al. |
| 5,658,372 A | 8/1997 | Gadkaree |
| 5,674,462 A | 10/1997 | Hayden et al. |
| 5,676,735 A | 10/1997 | McManus |
| 5,677,082 A | 10/1997 | Greinke et al. |
| 5,704,965 A | 1/1998 | Tom et al. |
| 5,704,967 A | 1/1998 | Tom et al. |
| 5,707,424 A | 1/1998 | Tom et al. |
| 5,710,092 A | 1/1998 | Baker |
| 5,744,421 A | 4/1998 | Robinson et al. |
| 5,750,026 A | 5/1998 | Gadkaree et al. |
| 5,761,910 A | 6/1998 | Tom et al. |
| 5,800,596 A | 9/1998 | Collin et al. |
| 5,827,355 A | 10/1998 | Wilson et al. |
| 5,833,936 A | 11/1998 | Euzen et al. |
| 5,837,027 A | 11/1998 | Olander et al. |

(56) References Cited

U.S. PATENT DOCUMENTS

| | | |
|---|---|---|
| 5,837,741 A | 11/1998 | Schwarz et al. |
| 5,846,639 A | 12/1998 | Robinson et al. |
| 5,851,270 A | 12/1998 | Olander |
| 5,851,403 A | 12/1998 | Petrisko et al. |
| 5,858,067 A | 1/1999 | McManus |
| 5,876,487 A | 3/1999 | Dahlgren et al. |
| 5,882,384 A | 3/1999 | Tom et al. |
| 5,902,562 A | 5/1999 | Lagasse et al. |
| 5,912,424 A | 6/1999 | Judkins et al. |
| 5,914,294 A | 6/1999 | Park et al. |
| 5,916,245 A | 6/1999 | Tom |
| 5,917,140 A | 6/1999 | Tom |
| 5,935,305 A | 8/1999 | Tom et al. |
| 5,961,697 A | 10/1999 | McManus et al. |
| 5,965,483 A | 10/1999 | Baker et al. |
| 5,972,253 A | 10/1999 | Kimber |
| 5,972,834 A | 10/1999 | Ohsaki et al. |
| 5,980,616 A | 11/1999 | Johnson et al. |
| 5,985,008 A | 11/1999 | Tom et al. |
| 5,993,766 A | 11/1999 | Tom et al. |
| 6,006,797 A | 12/1999 | Buelow et al. |
| 6,019,823 A | 2/2000 | Tischler et al. |
| 6,027,547 A | 2/2000 | Tom et al. |
| 6,030,698 A | 2/2000 | Burchell et al. |
| 6,083,298 A | 7/2000 | Wang et al. |
| 6,089,027 A | 7/2000 | Wang et al. |
| 6,097,011 A | 8/2000 | Gadkaree et al. |
| 6,101,816 A | 8/2000 | Wang et al. |
| 6,110,257 A | 8/2000 | Tom |
| 6,125,131 A | 9/2000 | Brandes et al. |
| 6,132,492 A | 10/2000 | Hultquist et al. |
| 6,143,058 A | 11/2000 | Dahlgren et al. |
| 6,155,289 A | 12/2000 | Carlsen et al. |
| 6,156,697 A | 12/2000 | Gadkaree |
| 6,171,373 B1 | 1/2001 | Park et al. |
| 6,187,713 B1 | 2/2001 | Gadkaree |
| 6,194,650 B1 | 2/2001 | Wakayama et al. |
| 6,197,097 B1 | 3/2001 | Ertl et al. |
| 6,204,180 B1 | 3/2001 | Tom et al. |
| 6,207,264 B1 | 3/2001 | Robinson et al. |
| 6,225,257 B1 | 5/2001 | Putyera et al. |
| 6,258,300 B1 | 7/2001 | Burchell et al. |
| 6,284,705 B1 | 9/2001 | Park et al. |
| 6,294,501 B1 | 9/2001 | Chang |
| 6,298,515 B1 | 10/2001 | Robinson |
| 6,309,446 B1 | 10/2001 | Nakanoya et al. |
| 6,309,449 B1 | 10/2001 | Klos et al. |
| 6,406,519 B1 | 6/2002 | Tom et al. |
| 6,436,175 B1 | 8/2002 | Coates et al. |
| 6,453,924 B1 | 9/2002 | Wang et al. |
| 6,475,411 B1 | 11/2002 | Burchell et al. |
| 6,475,461 B1 | 11/2002 | Ohsaki et al. |
| 6,482,316 B1 | 11/2002 | Bal |
| 6,500,238 B1 | 12/2002 | Brandes et al. |
| 6,521,019 B2 | 2/2003 | Jain et al. |
| 6,540,819 B2 | 4/2003 | Tom et al. |
| 6,558,457 B1 | 5/2003 | Kolczyk |
| 6,561,213 B2 | 5/2003 | Wang et al. |
| 6,592,653 B2 | 7/2003 | Wang et al. |
| 6,626,981 B2 | 9/2003 | Wojtowicz et al. |
| 6,660,063 B2 | 12/2003 | Tom et al. |
| 6,670,039 B1 | 12/2003 | Nagle et al. |
| 6,670,304 B2 | 12/2003 | Chang |
| 6,699,561 B2 | 3/2004 | Wolff |
| 6,716,271 B1 | 4/2004 | Arno et al. |
| 6,743,278 B1 | 6/2004 | Carruthers |
| 6,764,755 B2 | 7/2004 | Tom et al. |
| 6,790,390 B2 | 9/2004 | Py et al. |
| 6,793,718 B2 | 9/2004 | Mochizuki et al. |
| 6,911,260 B2 | 6/2005 | Ren et al. |
| 6,939,394 B2 | 9/2005 | Carruthers |
| 6,991,671 B2 | 1/2006 | Brestovansky et al. |
| 7,172,645 B1 | 2/2007 | Pfister et al. |
| D545,393 S | 6/2007 | Brestovansky et al. |
| 7,306,651 B2 | 12/2007 | Cieutat et al. |
| 7,455,719 B2 | 11/2008 | Carruthers |
| 7,494,530 B2 | 2/2009 | Carruthers |
| 7,501,010 B2 | 3/2009 | Brestovansky et al. |
| 7,731,836 B2 | 6/2010 | Nicolaos et al. |
| 7,744,748 B2 | 6/2010 | Nicolaos et al. |
| 7,862,646 B2 | 1/2011 | Carruthers et al. |
| 7,964,530 B2 | 6/2011 | Nanba et al. |
| 7,972,421 B2 | 7/2011 | Brestovansky et al. |
| 8,002,880 B2 | 8/2011 | Carruthers |
| 8,133,302 B2 | 3/2012 | Northrop et al. |
| 8,221,532 B2 | 7/2012 | Carruthers et al. |
| 8,227,376 B2 | 7/2012 | Karles et al. |
| 8,282,714 B2 | 10/2012 | Carruthers |
| 8,679,231 B2 | 3/2014 | Wilson et al. |
| 8,858,685 B2 | 10/2014 | Carruthers |
| 2002/0020292 A1 | 2/2002 | Wojtowicz et al. |
| 2002/0073847 A1 | 6/2002 | Sheline et al. |
| 2002/0084223 A1 | 7/2002 | Feimer et al. |
| 2002/0194989 A1 | 12/2002 | Tuma et al. |
| 2003/0044603 A1 | 3/2003 | Morita et al. |
| 2003/0062312 A1 | 4/2003 | Cannon et al. |
| 2003/0113598 A1 | 6/2003 | Chow et al. |
| 2003/0127385 A1 | 7/2003 | Spriegel |
| 2003/0145731 A1 | 8/2003 | Biasio |
| 2003/0157014 A1 | 8/2003 | Wang et al. |
| 2003/0196553 A1 | 10/2003 | Mochizuki et al. |
| 2003/0205581 A1 | 11/2003 | Wertenberger |
| 2004/0007506 A1 | 1/2004 | Song et al. |
| 2004/0028901 A1 | 2/2004 | Rumpf et al. |
| 2004/0107838 A1 | 6/2004 | Carruthers |
| 2004/0118286 A1 | 6/2004 | Brestovansky et al. |
| 2004/0185254 A1 | 9/2004 | Carruthers |
| 2005/0013635 A1 | 1/2005 | Yamada |
| 2005/0014643 A1 | 1/2005 | Lini et al. |
| 2005/0029194 A1 | 2/2005 | Hall et al. |
| 2005/0075528 A1 | 4/2005 | Burkhardt et al. |
| 2005/0092675 A1 | 5/2005 | Nakahara et al. |
| 2005/0169829 A1 | 8/2005 | Dai et al. |
| 2005/0173297 A1 | 8/2005 | Toida |
| 2005/0176989 A1 | 8/2005 | Coleman et al. |
| 2005/0188846 A1 | 9/2005 | Carruthers |
| 2005/0235619 A1 | 10/2005 | Heinz et al. |
| 2006/0011064 A1 | 1/2006 | Carruthers |
| 2006/0131217 A1 | 6/2006 | Nicolaos et al. |
| 2006/0283779 A1 | 12/2006 | Feimer et al. |
| 2007/0021300 A1 | 1/2007 | Farant |
| 2007/0031325 A1 | 2/2007 | Carruthers et al. |
| 2008/0213523 A1 | 9/2008 | Fujimoto et al. |
| 2009/0038477 A1 | 2/2009 | Abe et al. |
| 2009/0173225 A1 | 7/2009 | Brestovansky et al. |
| 2009/0188392 A1 | 7/2009 | Carruthers |
| 2009/0258782 A1 | 10/2009 | Gogotsi et al. |
| 2009/0304570 A1 | 12/2009 | Kim et al. |
| 2010/0116136 A1 | 5/2010 | Wojtowicz et al. |
| 2010/0142122 A1 | 6/2010 | Tanaka |
| 2010/0213083 A1 | 8/2010 | Olander et al. |
| 2011/0048063 A1 | 3/2011 | Carruthers et al. |
| 2011/0277846 A1 | 11/2011 | Brestovansky et al. |
| 2012/0024157 A1 | 2/2012 | Maheshwary et al. |
| 2012/0180660 A1 | 7/2012 | Wilson et al. |
| 2012/0305450 A1 | 12/2012 | Carruthers et al. |
| 2012/0325850 A1 | 12/2012 | Carruthers |
| 2013/0112076 A1 | 5/2013 | Baum et al. |
| 2013/0298769 A1 | 11/2013 | Petruska et al. |
| 2014/0027352 A1 | 1/2014 | Petruska et al. |
| 2014/0202547 A1 | 7/2014 | Wilson et al. |
| 2014/0298992 A1 | 10/2014 | Carruthers et al. |
| 2015/0027909 A1 | 1/2015 | Carruthers et al. |
| 2015/0360164 A1 | 12/2015 | Carruthers et al. |

FOREIGN PATENT DOCUMENTS

| | | |
|---|---|---|
| CN | 1482210 A | 3/2004 |
| CN | 1723072 A | 1/2006 |
| DE | 1095796 B | 12/1960 |
| DE | 2264512 A | 1/1974 |
| DE | 3139781 A1 | 4/1983 |
| DE | 202007014890 U1 | 5/2008 |
| EP | 0344917 A1 | 12/1989 |

(56) References Cited

FOREIGN PATENT DOCUMENTS

| | | |
|---|---|---|
| EP | 0684071 A2 | 11/1995 |
| EP | 0860640 A1 | 8/1998 |
| EP | 0891943 A1 | 1/1999 |
| EP | 1064996 A1 | 1/2001 |
| EP | 1072839 A2 | 1/2001 |
| FR | 2550466 A1 | 2/1985 |
| GB | 1385922 A | 3/1975 |
| GB | 2232364 A | 12/1990 |
| JP | 52-72373 A | 6/1977 |
| JP | 55-73315 A | 6/1980 |
| JP | 56-109809 A | 8/1981 |
| JP | 56-158087 A | 12/1981 |
| JP | 56-158126 A | 12/1981 |
| JP | 57501466 A | 8/1982 |
| JP | 5884038 A | 5/1983 |
| JP | 60-150831 A | 8/1985 |
| JP | 60-179140 A | 9/1985 |
| JP | 60171215 A | 9/1985 |
| JP | 61-133116 A | 6/1986 |
| JP | 61-144495 A | 7/1986 |
| JP | 62176909 A | 8/1987 |
| JP | 63-88017 A | 4/1988 |
| JP | 63501144 A | 4/1988 |
| JP | 63-156542 A | 6/1988 |
| JP | 63-315146 A | 12/1988 |
| JP | 1-131015 A | 5/1989 |
| JP | 2-66399 A | 3/1990 |
| JP | 2273589 A | 11/1990 |
| JP | 3127606 A | 5/1991 |
| JP | 4-171046 A | 6/1992 |
| JP | 4-224102 A | 8/1992 |
| JP | 5-9015 A | 1/1993 |
| JP | 6-9015 A | 1/1993 |
| JP | 6-2984 A | 1/1994 |
| JP | 6233915 A | 8/1994 |
| JP | 7-124468 A | 5/1995 |
| JP | 8-52318 A | 2/1996 |
| JP | 08-504394 A | 5/1996 |
| JP | 8-187074 A | 7/1996 |
| JP | 8-200876 A | 8/1996 |
| JP | 9108569 A | 4/1997 |
| JP | 9-242995 A | 9/1997 |
| JP | 9511683 A | 11/1997 |
| JP | 1066823 A | 3/1998 |
| JP | 10-141803 A | 5/1998 |
| JP | 10-185353 A | 7/1998 |
| JP | 1182891 A | 3/1999 |
| JP | 11128722 A | 5/1999 |
| JP | 11-166772 A | 6/1999 |
| JP | 11-511233 A | 9/1999 |
| JP | 2000-28098 A | 1/2000 |
| JP | 2000-500842 A | 1/2000 |
| JP | 2000-205496 A | 7/2000 |
| JP | 2001212413 A | 8/2001 |
| JP | 2001239122 A | 9/2001 |
| JP | 2001-287905 A | 10/2001 |
| JP | 2002-29724 A | 1/2002 |
| JP | 2002-102689 A | 4/2002 |
| JP | 2002-156097 A | 5/2002 |
| JP | 2002-158021 A | 5/2002 |
| JP | 2002273589 A | 9/2002 |
| JP | 2002356318 A | 12/2002 |
| JP | 2003117335 A | 4/2003 |
| JP | 2003226511 A | 8/2003 |
| JP | 2003290610 A | 10/2003 |
| JP | 2003-535803 A | 12/2003 |
| JP | 2004-261739 A | 9/2004 |
| JP | 2004277229 A | 10/2004 |
| JP | 2004333635 A | 11/2004 |
| JP | 2005350319 A | 12/2005 |
| JP | 2006-7127 A | 1/2006 |
| JP | 2006512542 A | 4/2006 |
| KR | 20010073040 A | 7/2001 |
| KR | 1020120020209 A | 3/2012 |
| KR | 1020120101737 A | 9/2012 |
| SU | 1181692 A | 9/1985 |
| SU | 1544475 A | 2/1990 |
| SU | 1583151 A | 8/1990 |
| TW | 386890 B | 4/2000 |
| WO | 9407794 A1 | 4/1994 |
| WO | 9712669 A1 | 4/1994 |
| WO | 9500234 A1 | 1/1995 |
| WO | 9611739 A1 | 4/1996 |
| WO | 9633801 A1 | 10/1996 |
| WO | 9712667 A1 | 4/1997 |
| WO | 9716509 A1 | 5/1997 |
| WO | 9744118 A1 | 11/1997 |
| WO | 9747382 A1 | 12/1997 |
| WO | 9830496 A1 | 7/1998 |
| WO | 9941010 A1 | 8/1999 |
| WO | 9959700 A1 | 11/1999 |
| WO | 9959701 A1 | 11/1999 |
| WO | 0012196 A1 | 3/2000 |
| WO | 0015330 A1 | 3/2000 |
| WO | 0193985 A1 | 12/2001 |
| WO | 0224310 A1 | 3/2002 |
| WO | 02051525 A1 | 7/2002 |
| WO | 02068324 A1 | 9/2002 |
| WO | 02081055 A1 | 10/2002 |
| WO | 02081372 A2 | 10/2002 |
| WO | 2007090104 A2 | 8/2007 |
| WO | 2007136887 A2 | 11/2007 |
| WO | 2008110233 A1 | 9/2008 |
| WO | 2009011750 A2 | 1/2009 |
| WO | 2012106218 A2 | 8/2012 |
| WO | 2012145337 A1 | 10/2012 |

OTHER PUBLICATIONS

Carrott, P., et al., "A New Method for the Determination of Micropore Size Distributions", "Studies in Surface Science and Catalysis: Characterization of Porous Solids", 1988, pp. 89-100, vol. 39.

Dacey, J., et al., "Adsorption on Saran Charcoal: A New Type of Molecular Sieve", "Trans. Faraday Soc.", Mar. 6, 1954, pp. 740-748, vol. 50.

Dacey, J., et al., "The formation of carbon from polyvinylidene chloride", "Proceedings of the Fourth Conference on carbon", 1960, pp. 315-319.

Jimenez-Cruz, F., et al., "Adsorption of n-Heptane and 2-Methylheptane in the Gas Phase on Polyvinylidene Chlorie-Based Microporous Activated Carbon", "Energy and Fuels", Aug. 17, 2007, pp. 2929-2934, vol. 21.

Jung, H., et al., "Pore Structure Characterization of Poly(vinylidene chloride)-Derived Nanoporous Carbons", "Carbon Letters", Oct. 31, 2012, pp. 236-242, vol. 13, No. 4.

Kitagawa, H., "Production of Molecular Sieving Carbon and Its Applications", 1992, pp. 1-15, vol. 35, No. 12, Publisher National Institute for Resources and Environment, Published in: Tsukuba, Japan.

Kitagawa, H., "Production of Molecular Sieving Carbon and Its Applications", 1992, pp. 1-15 (English Translation), vol. 35, No. 12, Publisher: National Institute for Resources and Environment, Published in: Tsukuba, Japan.

MacDonald, J., et al, "Carbon Adsorbents for Natural Gas Storage", "Fuel", Jan. 1998, pp. 61-64, vol. 77, No. 112.

Parkyns, N., et al., "Chapter 11: Natural Gas Adsorbed on Carbon", "Porosity in Carbons: Characterization and Applications", 1995, pp. 291-325.

Polarz, S., et al, "Nanoporous Materials", "Journal of Nanoscience and Nanotechnology", Dec. 2002, pp. 581-612, vol. 2, No. 6.

Quinn, D., et al, "Natural Gas Storage", "Carbon", Feb. 1992, pp. 1097-1103, vol. 30, No. 7.

Rouquerol, F., et al., "Chapter 9.5A: Adsorption of water vapour", "Adsorption by Powders and Porous Solids: Principles, Methodology, and Applications", Oct. 1998, pp. 276-277.

Sing, K. et al., "Reporting Physisorption Data for Gas/Solid Systems with Special Reference to the Determination 01 Surface Area and Porosity", "Pure Appl. Chem.", 1985, pp. 603-619, vol. 57, No. 4.

(56) References Cited

OTHER PUBLICATIONS

Tornatore, P., et al., "Water Online (www.wateronline.com/doc/synthetic-adsorbents-show-promise-for-removin-0001)", Jun. 28, 2000, pp. 1-7.

Wojtowicz, M., et al., "Microporous Carbon Adsorbents for Hydrogen Storage", "Int. J. Soc. of Mater. Eng. Resour.", 1999, pp. 253-266, vol. 7, No. 2.

Xu, B., et al., "An Activation-Free Method for Preparing Microporous Carbon by the Pyrolysis of Poly(Vinylidene Fluoride)", "Carbon", Apr. 14, 2010, pp. 2812-2814, vol. 48.

Zhu, Z. et al.,"New Insights into the Interaction of Hydrogen Atoms with Boron-Substituted Carbon", "J. Phys. Chem. B", Jan. 26, 2006, pp. 1249-1255, vol. 110.

Zhang, Y., et al., "Study of Adsorption Capacity of Porous Structure of Porous Carbon Material for Sulfides in Diesel Fuel", "Carbon Processes and Devices", Dec. 31, 2006, pp. 176-182, vol. 11.

Zhang, Y., et al, "Study of Adsorption Capacity of Porous Structure of Porous Carbon Material for Sulfides in Diesel Fuel", "Carbon Processes and Devices", Dec. 31, 2006, pp. 176-182 (Partial English Translation), vol. 11.

\* cited by examiner

PVDF PYROLYZATE ADSORBENT AND GAS STORAGE AND DISPENSING SYSTEM UTILIZING SAME

CROSS-REFERENCE TO RELATED APPLICATIONS

This application is a continuation under 35 USC 120 of U.S. patent application Ser. No. 14/224,536 filed Mar. 25, 2014 in the names of Shaun M. Wilson and Edward A. Sturm for "PVDF PYROLYZATE ADSORBENT AND GAS STORAGE AND DISPENSING SYSTEM UTILIZING SAME," which in turn is a continuation under 35 USC 120 of U.S. patent application Ser. No. 13/329,254 filed Dec. 17, 2011 in the names of Shaun M. Wilson and Edward A. Sturm for "PVDF PYROLYZATE ADSORBENT AND GAS STORAGE AND DISPENSING SYSTEM UTILIZING SAME", issued Mar. 25, 2014 as U.S. Pat. No. 8,679,231, which claims the benefit under 35 USC 119 of U.S. Provisional Patent Application No. 61/434,219 filed Jan. 19, 2011 in the names of Shaun M. Wilson and Edward A. Sturm for "PVDF PYROLYZATE ADSORBENT AND GAS STORAGE AND DISPENSING SYSTEM UTILIZING SAME." The disclosures of U.S. patent application Ser. No. 14/224,536 and Ser. No. 13/329,254, and U.S. Provisional Patent Application No. 61/434,219 are hereby incorporated herein by reference, in their entireties, for all purposes.

FIELD

The present disclosure relates to an adsorbent useful in sorbent-based gas storage and dispensing systems, e.g., for fluorocompound gases such as gaseous fluorides, and to methods of making and using such adsorbent and gas storage and dispensing systems.

DESCRIPTION OF THE RELATED ART

The use of molecular fluorine in industry has been limited due to its toxic nature and high degree of reactivity. There are nonetheless a number of applications in which the use of molecular fluorine is necessary, such as the synthesis of uranium hexafluoride and sulfur hexafluoride, and cleaning of semiconductor processing tools (CVD reactors, ion implanters, epitaxial chambers, etc.). Fluorocompound gases such as $NF_3$ can also be used in cleaning of semiconductor processing tools.

In the supply of industrial gases, a wide variety of gas source packages are utilized. In semiconductor manufacturing and other industrial processes, adsorbent-based gas storage and dispensing systems have been developed, which provide safe and effective supply sources for numerous process gases. One such adsorbent-based gas storage and dispensing system is commercially available from ATMI, Inc. (Danbury, Conn., USA) under the trademark SDS. By utilizing physical adsorbent materials for storing gases in an adsorbed state, and dispensing same from the adsorbent under desorption conditions, gases can be stored at low pressures for enhanced safety, relative to high-pressure gas cylinders that have been conventionally employed in the past.

One adsorbent material that has been usefully employed in such sorbent-based gas storage and dispensing systems is a carbon adsorbent that is formed by pyrolysis from polyvinylidene chloride (PVDC). Such adsorbent is highly effective for gases such as arsine, phosphine, silane, boron trichloride, boron trifluoride, germanium tetrafluoride, hydrogen selenide, hydrogen telluride, and a wide variety of other acid gases, organometallic gaseous reagents, etc., but our experience suggests a potential exists for gases such as fluorine and $NF_3$ to decompose on such carbon adsorbent during storage.

Further, despite the many desirable characteristics and advantages attendant the use of physical adsorbent media for storage and dispensing of gases, currently there is no adsorbent commercially available that has demonstrated utility to safely and reversibly store molecular fluorine or $NF_3$.

SUMMARY

The present disclosure relates to an adsorbent useful in sorbent-based gas storage and dispensing systems, and to methods of making and using such adsorbent and gas storage and dispensing systems.

The disclosure in one aspect relates to polyvinylidene fluoride (PVDF) pyrolyzate carbon adsorbent.

The disclosure in another aspect relates to a carbon adsorbent of such type, having gas adsorbed thereon.

In another aspect, the disclosure relates to a carbon adsorbent of the foregoing type, disposed in a fluid storage and dispensing vessel configured to store gas having sorptive affinity for the carbon adsorbent in an adsorbed state, and to discharge gas desorbed from the carbon adsorbent under dispensing conditions.

A further aspect of the disclosure relates to a method of gas handling, comprising one of (i) adsorbing on, and (ii) desorbing gas from, a polyvinylidene fluoride (PVDF) pyrolyzate carbon adsorbent.

Other aspects, features and embodiments of the disclosure will be more fully apparent from the ensuing description and appended claims.

DETAILED DESCRIPTION

Figure 1:
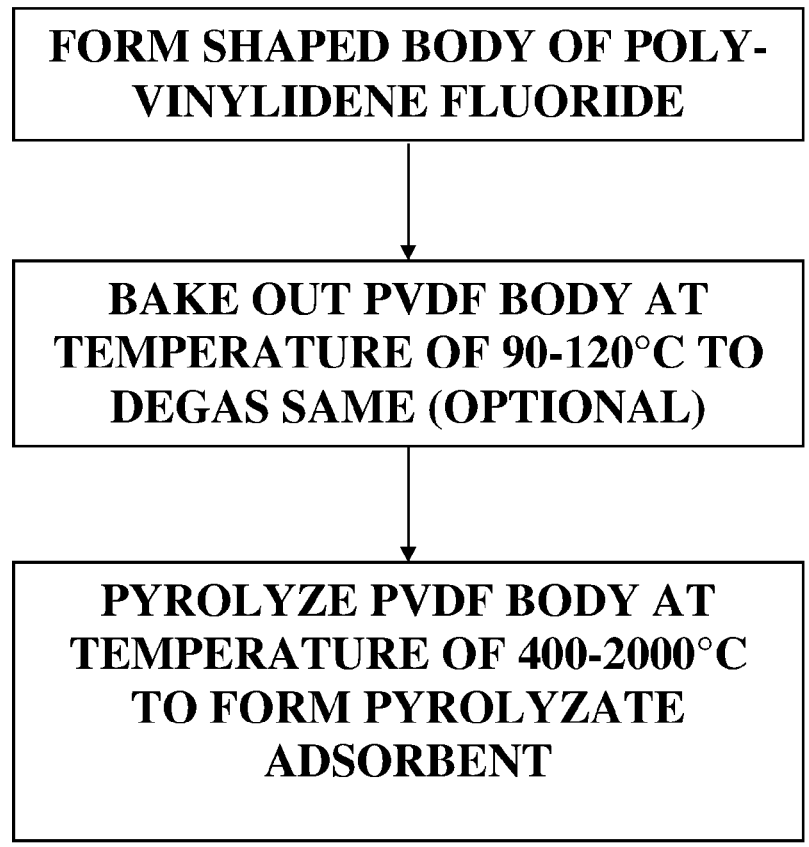
FIG. 1 is a schematic flowsheet for a process for forming a PVDF pyrolyzate adsorbent in accordance with one embodiment of the present disclosure.

The present disclosure relates to an adsorbent useful in sorbent-based gas storage and dispensing systems, and to methods of making and using such adsorbent and gas storage and dispensing systems.

The disclosure in one aspect relates to a polyvinylidene fluoride (PVDF) pyrolyzate carbon adsorbent. Carbon adsorbent of such type can be readily formed by pyrolysis of a polyvinylidene fluoride (PVDF) polymer as hereinafter more fully described. Such carbon adsorbent may be of monolithic form, or alternatively may be of particulate form, e.g., as beads, powders, or the like, or of other forms. The carbon adsorbent may be formed by a pyrolysis process wherein the pyrolysis of the PVDF polymer has been carried out to convert the polymer into a high capacity microporous active carbon having low reactivity to fluorine-containing gases. This can entail a pyrolysis carried out at suitable temperature, e.g., temperature of 400-600° C. or higher.

The carbon adsorbent of the present disclosure is usefully employed as an adsorbent material for a wide variety of gases. The carbon adsorbent can have a gas adsorbed thereon such as a fluorine-containing gas, e.g., fluorine gas, boron trifluoride, nitrogen trifluoride, carbofluorides, etc. The carbon adsorbent, while having utility for adsorptive storage and dispensing of fluorine or other fluorocompound gases, can be usefully employed with any gases having sorptive affinity for the carbon adsorbent. Examples of gases that may be utilized as sorbate gas species adsorbed on and desorbable from the carbon adsorbent of the disclosure, include, without limitation, arsine, phosphine, boron trichloride, boron trifluoride, silane, germane, phosgene, diborane, ammonia, stibine, hydrogen sulfide, hydrogen selenide, hydrogen telluride, nitrous oxide, hydrogen cyanide, ethylene oxide, deuterated hydrides, halide (chlorine, bromine, fluorine, and iodine) compounds, organometallic compounds, nitrogen trifluoride, fluorine, hydrogen fluoride, diboron tetrafluoride, and carbofluoride compounds.

In another aspect, the disclosure relates to a carbon adsorbent of a type as variously described herein, disposed in a fluid storage and dispensing vessel configured to store gas having sorptive affinity for the carbon adsorbent in an adsorbed state, and to discharge gas desorbed from the carbon adsorbent under dispensing conditions, as a gas storage and delivery apparatus comprising the carbon adsorbent of the present disclosure.

In such gas storage and delivery apparatus, a gas may be adsorbed on the carbon adsorbent, such as a fluorine-containing gas, e.g., selected from among fluorine, nitrogen trifluoride, or other highly reactive fluorine containing gas, or other gas as hereinabove described. The gas storage and delivery apparatus may comprise a storage vessel for retaining the carbon adsorbent and gas adsorbed thereon. The carbon adsorbent in such a gas storage and delivery apparatus can be of a monolithic form, or of bead, powder, film, particulate, or other suitable form, as indicated above. In various embodiments, the carbon adsorbent comprises a fluorine-containing group/complex formed by pyrolysis of the PVDF polymer to reduce reactivity of the carbon adsorbent to fluorine-containing gases. Monolithic forms of the carbon adsorbent may be of any suitable size and dimensions, and may for example be in the form of pucks or discs that are vertically stackable on one another in a vessel to form a stacked array in which the successive pucks or discs are in face-to-face abutting relationship to one another. The monolithic form may include rods or cylinders of the carbon adsorbent, or rectangular parallelepiped geometric forms.

The disclosure in a further aspect relates to a method of gas handling, comprising one of (i) adsorbing on, and (ii) desorbing gas from, a polyvinylidene fluoride (PVDF) pyrolyzate carbon adsorbent of the disclosure. Such method may comprise desorbing gas from the carbon adsorbent, and utilizing the desorbed gas in the manufacture of a semiconductor, flat panel display, or solar product. Semiconductor products may include integrated circuitry devices and device structures, microelectromechanical devices, optoelectronic devices, etc. Flat-panel displays may include computer monitor and television display products. Solar products may include photovoltaic cells and thermal solar arrays.

The disclosure also contemplates a method of storing and delivering gas, comprising adsorbing a gas on, and desorbing gas from, a carbon adsorbent of the present disclosure. The carbon adsorbent may be disposed in a storage vessel including a valve head assembly that is coupleable with associated flow circuitry. The carbon adsorbent may be formed in such manner as to reduce reactivity of the carbon adsorbent to fluorine-containing gases, relative to a corresponding carbon adsorbent not derived from PVDF polymer.

The present disclosure is based on our discovery that by using polyvinylidene fluoride (PVDF) as a starting material, a pyrolyzate adsorbent can be formed that is suitable for use as an effective gas storage medium for a wide variety of gases, including fluorine-containing gases such as fluorine and nitrogen trifluoride, as well as non-fluorine-containing gases. The processing of the PVDF starting material may be carried out to produce PVDF pyrolyzate adsorbent material of desired porosity, pore structure and pore size distribution, within the skill of the art, based on the disclosure herein.

FIG. 1 is a schematic flowsheet for a process for forming a PVDF pyrolyzate adsorbent in accordance with one embodiment of the present disclosure.

As illustrated in such flowsheet, a shaped body is formed of polyvinylidene fluoride. The shaped body may be of any suitable size, and may be geometrically regular or irregular in character. The shaped body may be shaped so that after processing including pyrolysis the pyrolyzate mass closely conforms to the interior volume of a gas storage and dispensing vessel. For example, the gas storage and dispensing vessel may be of a cylindrical geometry, closed at one end and open at the other, and the pyrolyzate mass may be of corresponding cylindrical form as a result of use of a mold or other form to provide such geometry. In such manner, the pyrolyzate mass may be introduced to the open end of the gas storage and dispensing vessel, during the fabrication thereof, with the vessel being closed by a top plate or valve head structure to provide an enclosed interior volume containing the PVDF pyrolyzate adsorbent.

As an alternative, the polyvinylidene fluoride starting material may be provided in resin form in the first instance, to fill a predetermined amount of the interior volume of the gas storage and dispensing vessel, so that subsequent processing including pyrolysis is carried out in situ in the vessel. In still other embodiments, the starting material can be a PVDF polymer powder that is processed without an initial shaping process, to produce a corresponding PVDF pyrolyzate of powder form.

The PVDF starting material may be a homopolymer of vinylidene fluoride or alternatively a copolymer comprising PVDF and one or more other polymer components, e.g., as a polymerization product of comonomers including vinylidene fluoride and one or more other comonomer species. The PVDF starting material may also comprise other materials such as plasticizers, surfactants, or other additives, adjuvants, etc., as necessary or desirable in a given application to provide a PVDF precursor with certain processability or a pyrolyzate adsorbent of desired character.

Subsequent to forming a shaped body of PVDF starting material, as illustrated in the flowsheet of FIG. 1, the PVDF body is baked out at elevated temperature to degas the material. Such bake-out may be carried out at any suitable temperature, e.g., temperature in a range of from 90° C. to 120° C., as appropriate to carry out pre-pyrolysis processing of the PVDF material. In other embodiments, such pre-pyrolysis processing is not carried out, and the starting material is of suitable character for pyrolysis without bake-out or degassing of the starting material.

The pyrolysis of the PVDF body is carried out by heating to a suitable elevated temperature, e.g., temperature in a range of from 800° C. to 2000° C. at a controlled ramp rate, to form the PVDF pyrolyzate adsorbent of desired porosity character. The pyrolysis operation may be carried out to produce a PVDF pyrolyzate that is highly porous in character, with desired porosity, loading capacity, bulk density and other characteristics. It will be recognized that the time-temperature relationship of the pyrolysis operation can be substantially varied, together with pyrolysis conditions such as pressure, ambient environment, etc., to achieve such desired characteristics. Accordingly, the pyrolysis operation conditions may be initially determined using sample PVDF bodies, with variation of the pyrolysis conditions as necessary to empirically establish and define a process envelope of pyrolysis conditions for the subsequent production of the PVDF pyrolyzate adsorbent.

The PVDF pyrolyzate may include, in various specific embodiments, porosity including pores of a size in a range of from 0.2 to 5 nanometers, e.g., with at least 30% of overall porosity of the adsorbent comprising pores having a size in a range of from about 0.3 to about 0.72 nanometer, and at least 50% of the overall porosity comprising pores of diameter <2 nanometers.

The PVDF pyrolyzate carbon material in various embodiments may be formed by pyrolysis and optional activation at temperatures in a range of from 400° C. to 1400° C. The PVDF pyrolyzate adsorbent in various embodiments has a bulk density of at least 0.6 grams per cubic centimeter, e.g., a bulk density of from about 0.6 to about 1.8 grams per cubic centimeter.

The PVDF starting material in other embodiments is pyrolyzed at temperature in a range from 400° C. to 900° C., in the absence of air, typically under inert atmosphere comprising gas such as argon or nitrogen. At specific stages in the pyrolysis, the PVDF based carbon material may optionally be exposed to an oxidizing atmosphere, e.g., comprising carbon monoxide, oxygen and/or steam, at temperature above 250° C., such as temperature in a range of from 600 to 1300° C.

In some embodiments of the present disclosure, the pyrolysis of the PVDF material can be carried out under "incomplete pyrolysis" conditions, e.g., at temperature in a range of from 400° C. to 600° C., such that a residual amount of fluorine remains within the adsorbent material to provide a particularly low reactivity environment for storage of $F_2$.

The pyrolysis in other embodiments may be carried out to optimize the sorptive affinity and loading capacity of the PVDF pyrolyzate adsorbent for other fluorine-containing gases, such as nitrogen trifluoride, carbo-fluorides of varying formula (e.g., $C_xF_y$, wherein x and y are any suitable stoichiometrically appropriate numerical values), etc.

While the PVDF pyrolyzate adsorbent of the present disclosure is described herein with particular application to fluorine-containing gases as sorbate species useful for storage on and dispensing from the PVDF pyrolyzate adsorbent, it will be recognized that the utility of the PVDF pyrolyzate adsorbent is not thus limited, but rather extends to and includes gases of widely varied other types, including other halide gases, hydride gases, organometallic gaseous reagents, silanes, etc.

In general application, the form of the PVDF carbon pyrolyzate will depend on the shape or form of the PVDF resin precursor material and its shape or conformation. The PVDF carbon pyrolyzate may be formed from discrete resin particles of appropriate size, to yield activated carbon particles, granules, beads, films or the like. The precursor material, as mentioned, may be pyrolyzed in a vessel or form structure imparting a unitary character to the pyrolyzate material, e.g., so that it is formed as a monolithic pyrolyzate.

The monolithic pyrolyzate may have any suitable size and shape characteristics appropriate to its desired end use. For example, the monolithic pyrolyzate may be in the form of a cylinder, block, brick, or other geometrically regular or irregular shape of desired size and character.

The pyrolysis process may be carried out to produce a PVDF pyrolyzate adsorbent having fluorine permeability that may for example be at least 100 cc/psi/cm²/min at 275 kPa, and preferably at least 200 cc/psi/cm$_2$/min, and can for example in specific embodiments be in a range from 100 to 600 cc/psi/cm²/min or even higher. Illustrative embodiments of the PVDF pyrolyzate may have at least 100, at least 200, at least 300 or at least 500 cc/psi/cm²/min permeability for fluorine gas.

The particle size of the starting PVDF material in some embodiments may for example be primarily in a particle size range of from 100 to 250 microns, with a major fraction (>½) of particles being in the range of 150-200 microns. In other embodiments, the particle size distribution may vary and a major fraction of the PVDF particles may in a range of 100-150 microns. Such particulate starting material may be used to produce bead, film, or particulate form PVDF pyrolyzate adsorbent.

The particulate starting PVDF material may be pyrolyzed in various embodiments, so that the particles are consolidated by compaction and applied pressure to form a monolithic pyrolyzate material, and small amounts of plasticizer can be added to the precursor PVDF material, e.g., from 0.2 to 2% by weight in various embodiments, however such plasticizer material can be added in greater or lesser amounts in other specific embodiments of the disclosure. Such weight percentages of plasticizer are based on the total weight of the PVDF starting material.

It will be recognized from the foregoing that the pyrolysis operation may be carried out using PVDF starting material of widely varied character, to produce PVDF pyrolyzate adsorbent of correspondingly varied character.

Figure 2:
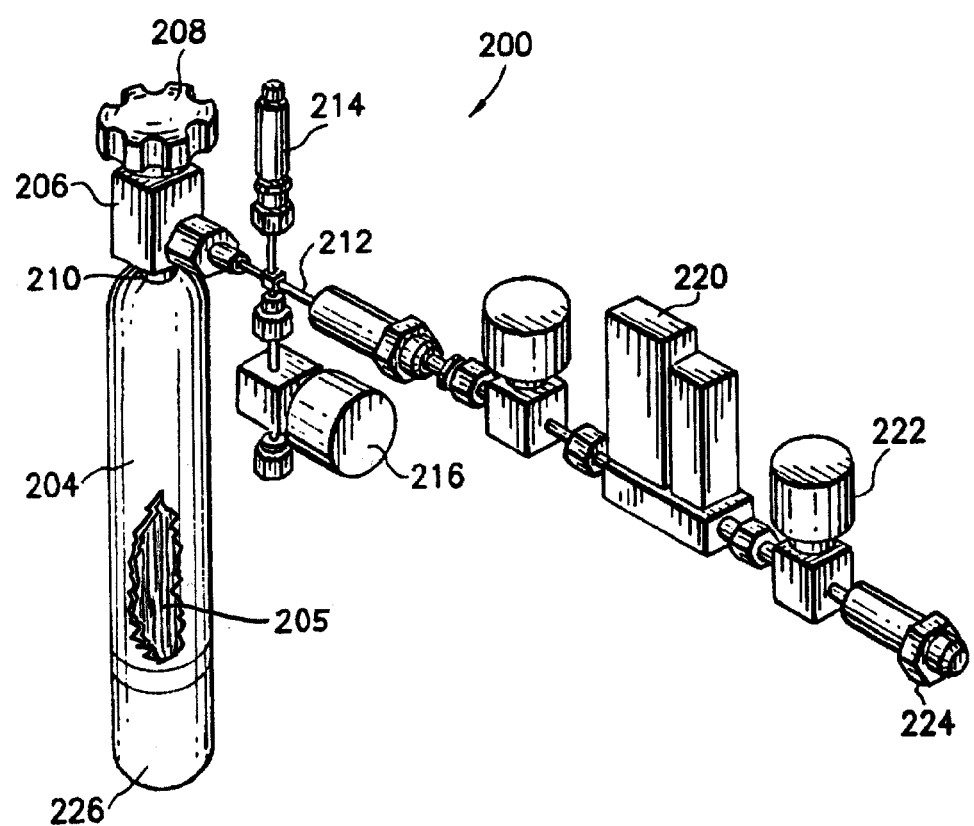
FIG. 2 is a schematic representation of a gas storage and delivery system utilizing a PVDF pyrolyzate adsorbent, according to one embodiment of the disclosure.

FIG. 2 is a schematic representation of a gas storage and delivery system utilizing a PVDF pyrolyzate adsorbent, according to one embodiment of the disclosure.

As shown, the storage and dispensing system 200 comprises a storage and dispensing vessel 204 that is joined at its upper portion to a valve head 206 comprising part of a dispensing assembly including manual actuator 208 for the valve head on the cylinder. In lieu of such manual actuator, an automatic valve actuator could be employed, such as a pneumatic valve actuator or actuator of other suitable type.

The vessel 204 can be formed of any suitable material of construction having stability in contact with the gas(es) intended to be stored therein, e.g., comprising material such as metals, glasses, ceramics, vitreous materials, polymers, and composite materials. Illustrative metals for such purpose include steel, stainless steel, aluminum, copper, brass, bronze, and alloys thereof. As an example, high nickel content alloys are useful materials of construction for vessels used for storage of fluorine. The valve head is joined by means of coupling 210 to a dispensing conduit 212 having disposed therein a pressure transducer 214, an inert purge unit 216 for purging the dispensing assembly with inert gas, a mass flow controller 220 for maintaining constant flow rate through the dispensing conduit 212 during the dispensing operation, and a filter 222 for removing particulates from the dispensed gas prior to its discharge from the dispensing assembly.

The dispensing assembly further comprises a coupling 224, for matably engaging the dispensing assembly with downstream piping, valving, or other structure associated with the locus of use of the desorbed fluid, e.g., involving a semiconductor manufacturing facility such as a chemical vapor deposition chamber. The fluid storage and dispensing vessel 204 is shown partially broken away to show the interior PVDF pyrolyzate adsorbent body 205.

The valve head of the vessel illustratively shown in FIG. 2 may include a fill port for introduction of sorbate gas to the PVDF pyrolyzate adsorbent in the interior volume of the vessel 204. Filling of the vessel may be carried out in any suitable manner, e.g., with monitoring of pressure during the fill operation, and with the introduction of sorbate gas being at sufficiently low flow rate so that the heat of adsorption effects can be dissipated in an efficient manner, to enable the vessel to be loaded with sufficient charge of sorbate gas to achieve high loading capacity of such gas on the adsorbent in the vessel.

The pressure monitoring during the fill operation may be carried out with introduction of gas in successive steps, whereby pressure drops in the vessel due to adsorption of the sorbate gas, following which the introduction of gas is resumed, and such stage-wise filling is carried out until the desired loading is achieved. Upon achievement of the desired loading of the vessel with the sorbate gas, the fill port is closed, and the charged vessel may thereafter be transported to an end use site, for gas dispensing service.

Subsequently, in use of the gas storage and delivery system, the adsorbed sorbate gas is desorbed under dispensing conditions, so that the desorbed gas can be discharged from the vessel through the valve in the valve head assembly, and flowed to a locus of use, such as a gas-utilizing apparatus. In various embodiments, the sorbate gas is fluorine gas, which is utilized for chemical synthesis. In other embodiments, the sorbate gas is fluorine gas or nitrogen trifluoride gas, which is utilized for cleaning of semiconductor process equipment such as vapor deposition chambers, ion implant chambers, etc. The desorption of the sorbate gas in the dispensing operation may be carried out by pressure differential, in which the gas storage and delivery system is coupled with flow circuitry at a lower pressure level than in the vessel, as a result of which the adsorbed gas desorbs from the PVDF pyrolyzate adsorbent, and flows to the flow circuitry.

Alternatively, the desorption of the sorbate gas can be effected by imposition of a concentration gradient, such as by flowing a non-sorbable, e.g., inert, carrier gas through the interior volume of the vessel, so that the resulting concentration gradient effects desorption of the sorbate gas and entrainment thereof in the carrier gas stream subsequently discharged from the gas storage and dispensing vessel.

As a still further desorption modality, the PVDF pyrolyzate adsorbent may be heated in a controlled manner, to effect thermally-mediated desorption of the sorbate gas for subsequent discharge from the gas storage and dispensing vessel.

It will be recognized that the foregoing modes of effecting desorption can be carried out in various combinations with one another, to achieve a desired dispensing flow of the desorbed sorbate gas.

Thus, the present disclosure provides a PVDF pyrolyzate adsorbent that may be usefully employed in a variety of applications requiring adsorption storage and subsequent dispensing desorption of gases. The disclosure also enables the production of PVDF pyrolyzate adsorbent from a PVDF starting material that is readily processed by pyrolysis to yield a pyrolyzate material of the desired character for such gas storage and dispensing applications.

While the disclosure has been set out herein in reference to specific aspects, features and illustrative embodiments thereof, it will be appreciated that the utility of the disclosure is not thus limited, but rather extends to and encompasses numerous other variations, modifications and alternative embodiments, as will suggest themselves to those of ordinary skill in the field of the present disclosure. Correspondingly, the invention as hereinafter claimed is intended to be broadly construed and interpreted, as including all such variations, modifications and alternative embodiments, within its spirit and scope.

What is claimed is:

1. A polyvinylidene fluoride (PVDF) pyrolyzate carbon adsorbent comprising residual fluorine therein deriving from the polyvinylidene fluoride.

2. The carbon adsorbent of claim 1, produced by pyrolysis at temperature insufficient to pyrolytically remove all fluorine from the polyvinylidene fluoride of which the carbon adsorbent is a pyrolyzate.

3. The carbon adsorbent of claim 1, produced by pyrolysis conducted at temperature in a range of from 400° C. to 600° C.

4. The carbon adsorbent of claim 1, of monolithic form.

5. The carbon adsorbent of claim 1, of particulate form.

6. The carbon adsorbent of claim 5, of a bead or powder particulate form.

7. The carbon adsorbent of claim 1, comprising porosity including pores of size in a range of from 0.2 to 5 nm.

8. The carbon adsorbent of claim 1, comprising porosity at least 30% of which comprises pores having size in a range of from 0.3 to 0.72 nm.

9. The carbon adsorbent of claim 1, comprising porosity at least 50% which comprises pores having a diameter of less than 2 nm.

10. The carbon adsorbent of claim 1, having a bulk density in a range of from 0.6 to 1.8 g/cm$^3$.

11. The carbon adsorbent of claim 1, having fluorine permeability in a range of from 100 to 600 cm$^3$/psi/cm$^2$/min.

12. The carbon adsorbent of claim 1, comprising porosity at least 30% of which comprises pores having size in a range of from 0.3 to 0.72, and at least 50% which comprises pores having a diameter of less than 2, the carbon adsorbent having a bulk density in a range of from 0.6 to 1.8 g/cm$^3$ and fluorine permeability in a range of from 100 to 600 cm$^3$/psi/cm$^2$/min.

13. A method of gas handling, comprising adsorbing a sorbable gas on a carbon adsorbent according to claim 1.

14. A method of gas handling, comprising adsorbing a sorbable gas on a polyvinylidene fluoride (PVDF) pyrolyzate carbon adsorbent comprising residual fluorine therein deriving from the polyvinylidene fluoride, wherein the sorbable gas comprises a fluorine-containing gas.

15. The method of claim 13, wherein the sorbable gas comprises a fluorine-containing gas selected from the group consisting of boron trifluoride, nitrogen trifluoride, fluorine, hydrogen fluoride, diboron tetrafluoride, and carbofluoride compounds.

16. The method of claim 13, wherein the sorbable gas comprises fluorine gas.

17. A method of gas handling, comprising desorbing from a carbon adsorbent according to claim 1 a gas previously adsorbed thereon.

18. A method of gas handling, comprising desorbing from a polyvinylidene fluoride (PVDF) pyrolyzate carbon adsorbent comprising residual fluorine therein deriving from the polyvinylidene fluoride, a gas previously adsorbed on said adsorbent, wherein the previously adsorbed gas comprises a fluorine-containing gas.

19. The method of claim 17, wherein the previously adsorbed gas comprises a fluorine-containing gas selected from the group consisting of boron trifluoride, nitrogen trifluoride, fluorine, hydrogen fluoride, diboron tetrafluoride, and carbofluoride compounds.

20. The method of claim 17, wherein the previously adsorbed gas comprises fluorine gas.

21. The method of claim 17, further comprising utilizing the desorbed gas in a process for manufacturing a semiconductor, flat-panel display, or solar product.

22. The method of claim 17, further comprising utilizing the desorbed gas for cleaning a semiconductor manufacturing apparatus.

* * * * *